US012765279B2

(12) United States Patent
Itatani et al.

(10) Patent No.: US 12,765,279 B2
(45) Date of Patent: Oct. 13, 2026

(54) SUBSTRATE PROCESSING METHOD AND SUBSTRATE PROCESSING SYSTEM

(71) Applicant: Tokyo Electron Limited, Tokyo (JP)

(72) Inventors: Takeshi Itatani, Yamanashi City (JP); Einosuke Tsuda, Nirasaki City (JP); Tadahiro Ishizaka, Nirasaki (JP); Satoshi Takeda, Nirasaki City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 823 days.

(21) Appl. No.: 17/947,545

(22) Filed: Sep. 19, 2022

(65) Prior Publication Data

US 2023/0096191 A1 Mar. 30, 2023

(30) Foreign Application Priority Data

Sep. 24, 2021 (JP) ................................ 2021-155339

(51) Int. Cl.

| | |
|---|---|
| ***H10P 14/40*** | (2026.01) |
| ***C23C 16/16*** | (2006.01) |
| ***C23C 16/54*** | (2006.01) |

(52) U.S. Cl.

CPC ............ *H10P 14/418* (2026.01); *C23C 16/16* (2013.01); *C23C 16/54* (2013.01)

(58) Field of Classification Search

None

See application file for complete search history.

(56) References Cited

U.S. PATENT DOCUMENTS

2023/0096191 A1* 3/2023 Itatani .................... C23C 16/04 438/677

FOREIGN PATENT DOCUMENTS

| | | | |
|---|---|---|---|
| JP | 2002-373861 A | | 12/2002 |
| JP | 2010-153483 A | | 7/2010 |
| JP | 2021-014613 A | | 2/2021 |
| JP | 2022148765 A | * | 10/2022 |
| KR | 10-2021-0007860 A | | 1/2021 |
| WO | 2021/167958 A1 | | 8/2021 |

* cited by examiner

*Primary Examiner* — Jack S Chen

(74) *Attorney, Agent, or Firm* — Nath, Goldberg & Meyer; Jerald L. Meyer; Tanya E. Harkins

(57) ABSTRACT

A method of forming a ruthenium film on a substrate by supplying a ruthenium-containing gas includes: forming an adsorption inhibition layer that inhibits adsorption of the ruthenium-containing gas by supplying an adsorption inhibition gas to an end portion and a rear surface of the substrate; transferring the substrate to a chamber; and forming the ruthenium film on the substrate by supplying the ruthenium-containing gas to the chamber.

12 Claims, 6 Drawing Sheets

213

SUBSTRATE PROCESSING METHOD AND SUBSTRATE PROCESSING SYSTEM

CROSS-REFERENCE TO RELATED APPLICATION

This application is based upon and claims the benefit of priority from Japanese Patent Application No. 2021-155339, filed on Sep. 24, 2021, the entire contents of which are incorporated herein by reference.

TECHNICAL FIELD

The present disclosure relates to a substrate processing method and a substrate processing system.

BACKGROUND

For example, a substrate processing apparatus that performs a film forming process on a substrate is known.

Patent Document 1 discloses a method of forming a ruthenium film, which includes: a process of supplying a chlorine-containing gas to a substrate having a recess including an insulating film such that chlorine is adsorbed at a higher density in an upper portion of the recess than in a lower portion of the recess; and a process of supplying a Ru-containing precursor to the recess where the chlorine is adsorbed to form the ruthenium film in the recess.

Patent Document 2 discloses a film forming apparatus for growing a film on a surface of a wafer, which includes: a chamber; a susceptor provided in the chamber and having a stage on which the wafer is placed; a heater configured to heat the wafer placed on the stage; a raw material gas instruction means configured to introduce, into the chamber, a raw material gas that reacts to form a solid by being heated; an inhibition gas flow path formed in the susceptor and having a downstream end that is open in an outer peripheral portion of the susceptor around the stage; and an inhibition gas supply means configured to supply, to the inhibition gas flow path, an inhibition gas that inhibits the reaction of the raw material gas.

Patent Document 3 discloses a batch-type heat treatment apparatus including at least: a heat furnace main body; a heating means disposed in the heat furnace main body; a reaction vessel received in the heat furnace main body and configured to accommodate a wafer boat in which workpieces are placed; a nozzle configured to supply a raw material gas into the reaction vessel; and a discharge port configured to discharge an exhaust gas in the reaction vessel, wherein a reaction inhibition gas supply nozzle provided with a plurality of holes for supplying a gas for inhibiting a film forming reaction is disposed in the reaction vessel.

PRIOR ART DOCUMENTS

Patent Documents

Patent Document 1: Japanese Patent Laid-Open Publication No. 2021-014613

Patent Document 2: Japanese Patent Laid-Open Publication No. 2010-153483

Patent Document 3: Japanese Patent Laid-Open Publication No. 2002-373861

However, in a film forming apparatus for forming a ruthenium film on a surface of a substrate, there is a concern that, due to an inflow of a film forming gas into a side surface or a rear surface of the substrate, the ruthenium film is formed on an end portion or the rear surface of the substrate and the end portion or the rear surface of the substrate is contaminated with ruthenium.

SUMMARY

According to one embodiment of the present disclosure, a method of forming a ruthenium film on a substrate by supplying a ruthenium-containing gas includes: forming an adsorption inhibition layer that inhibits adsorption of the ruthenium-containing gas by supplying an adsorption inhibition gas to an end portion and a rear surface of the substrate; transferring the substrate to a chamber; and forming the ruthenium film on the substrate by supplying the ruthenium-containing gas to the chamber

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
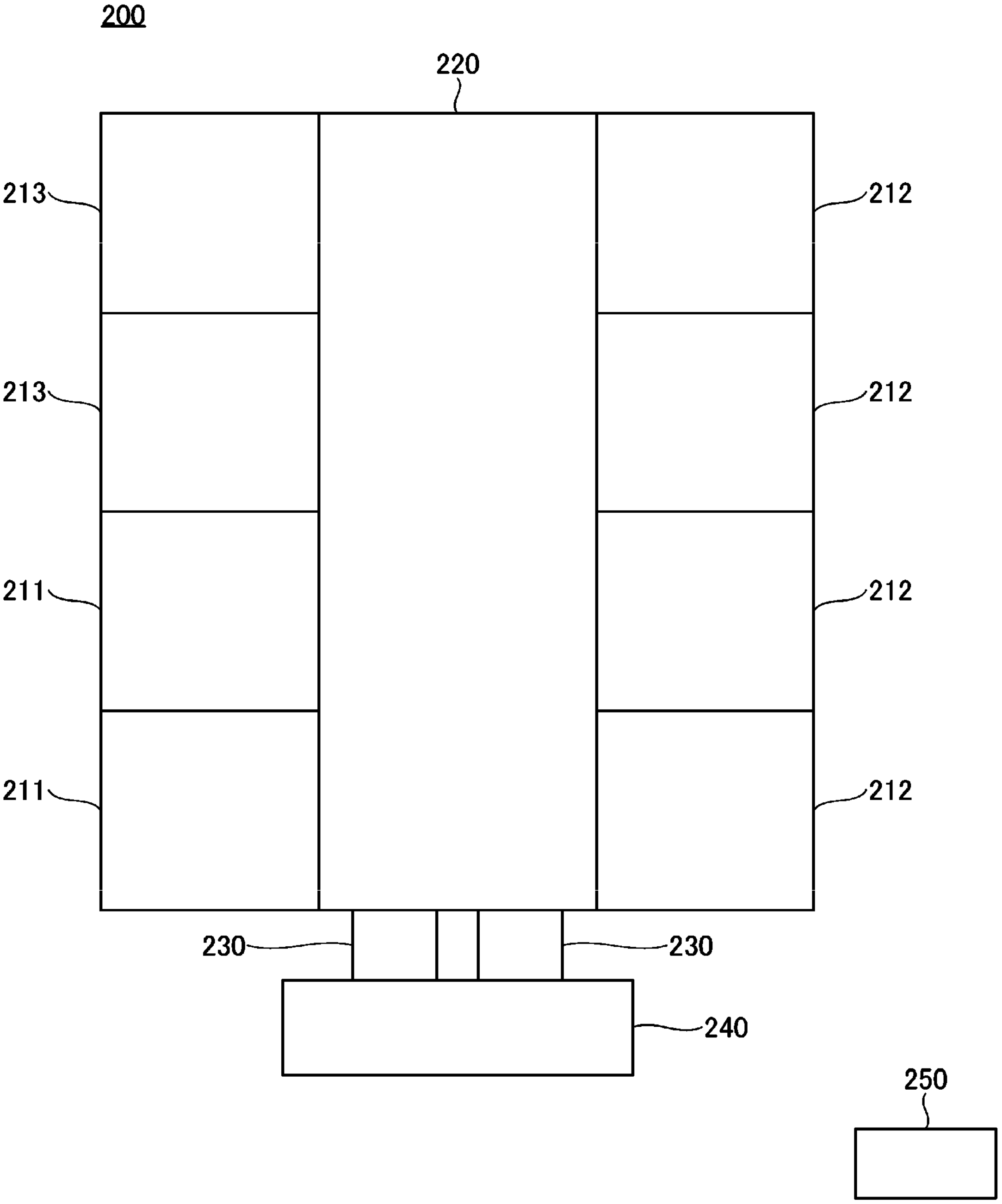
FIG. 1 is an example of a configuration view of a substrate processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. In each of the drawings, the same components may be denoted by the same reference numerals, and redundant descriptions thereof may be omitted.

<Substrate Processing Apparatus>

A substrate processing system 200 according to an embodiment will be described with reference to FIG. 1. FIG. 1 is an example of a configuration view of the substrate processing system 200.

The substrate processing system 200 includes substrate processing apparatuses 211 to 213, a vacuum transfer chamber 220, load-lock chambers 230, an atmospheric transfer chamber 240, and a controller 250.

Each of the substrate processing apparatuses 211 to 213 is depressurized to a predetermined vacuum atmosphere and performs therein a predetermined process on a substrate W (see FIGS. 2 to 4) such as a semiconductor. The substrate processing apparatuses 211 to 213 are disposed adjacent to the vacuum transfer chamber 220. The substrate processing apparatuses 211 to 213 are brought into communication with the vacuum transfer chamber 220 by opening and closing gate valves (not illustrated). In the substrate processing system 200 of the present embodiment, the substrate processing apparatuses 211 are apparatuses configured to form an adsorption inhibition layer that inhibits adsorption of ruthenium on a rear surface of the substrate W (a surface opposite to a front surface on which a ruthenium film, which will be described later, is formed). The substrate processing apparatuses 212 are apparatuses configured to form the ruthenium film on the front surface of the substrate W. The substrate processing apparatuses 213 are apparatuses configured to remove the adsorption inhibition layer formed on the rear surface of the substrate W. The substrate processing apparatuses 211 to 213 will be described later with reference to FIGS. 2 to 4.

The vacuum transfer chamber 220 is connected to a plurality of chambers (the substrate processing apparatuses 211 to 213 and the load-lock chambers 230) via gate valves (not illustrate) and is depressurized to a predetermined vacuum atmosphere. In addition, a transfer mechanism (not illustrated) configured to transfer the substrate W is provided inside the vacuum transfer chamber 220. The transfer mechanism moves and transfers the substrate W from one chamber (the substrate processing apparatuses 211 to 213 and the load-lock chambers 230) to another chamber (the substrate processing apparatuses 211 to 213 and the load-lock chambers 230) via the vacuum transfer chamber 220 according to opening and closing of the gate valves.

The load-lock chambers 230 are provided between the vacuum transfer chamber 220 and the atmospheric transfer chamber 240. Each of the load-lock chambers 230 includes a stage (not illustrated) on which the substrate W is placed. The load-lock chambers 230 are configured to switch between atmospheric atmosphere and a vacuum atmosphere. The load-lock chambers 230 are brought into communication with the vacuum transfer chamber 220 having the vacuum atmosphere by opening and closing the gate valves (not illustrated). The load-lock chambers 230 are brought into communication with the atmospheric transfer chamber 240 having atmospheric atmosphere by opening and closing door valves (not illustrated).

The atmospheric transfer chamber 240 has atmospheric atmosphere and, for example, a downflow of clean air is formed therein. A load port (not illustrated) is provided on a wall surface of the atmospheric transfer chamber 240. A carrier (not illustrated) accommodating the substrate W or an empty carrier is installed in the load port. As the carrier, for example, a front opening unified pod (FOUP) or the like may be used. Inside the atmospheric transfer chamber 240, a transfer mechanism (not illustrated) configured to transfer the substrate W is provided. The transfer mechanism transfers the substrate W between the load-lock chambers 230 and the carrier installed in the load port via the atmospheric transfer chamber 240 according to opening and closing of the door valves.

The controller 250 is, for example, a computer, and includes a central processing unit (CPU), a random access memory (RAM), a read only memory (ROM), an auxiliary storage device, and the like. The CPU operates based on a program stored in the ROM or the auxiliary storage device and controls operations of the substrate processing system 200.

As described above, the substrate processing system 200 of the present embodiment may form adsorption inhibition layers on rear surfaces of substrates W in the substrate processing apparatuses 211 while maintaining the vacuum atmosphere, form ruthenium films on front surfaces of the substrates W in the substrate processing apparatuses 212, and remove the adsorption inhibition layers of the substrates W in the substrate processing apparatuses 213.

<Substrate Processing Apparatus 212>

Figure 2:
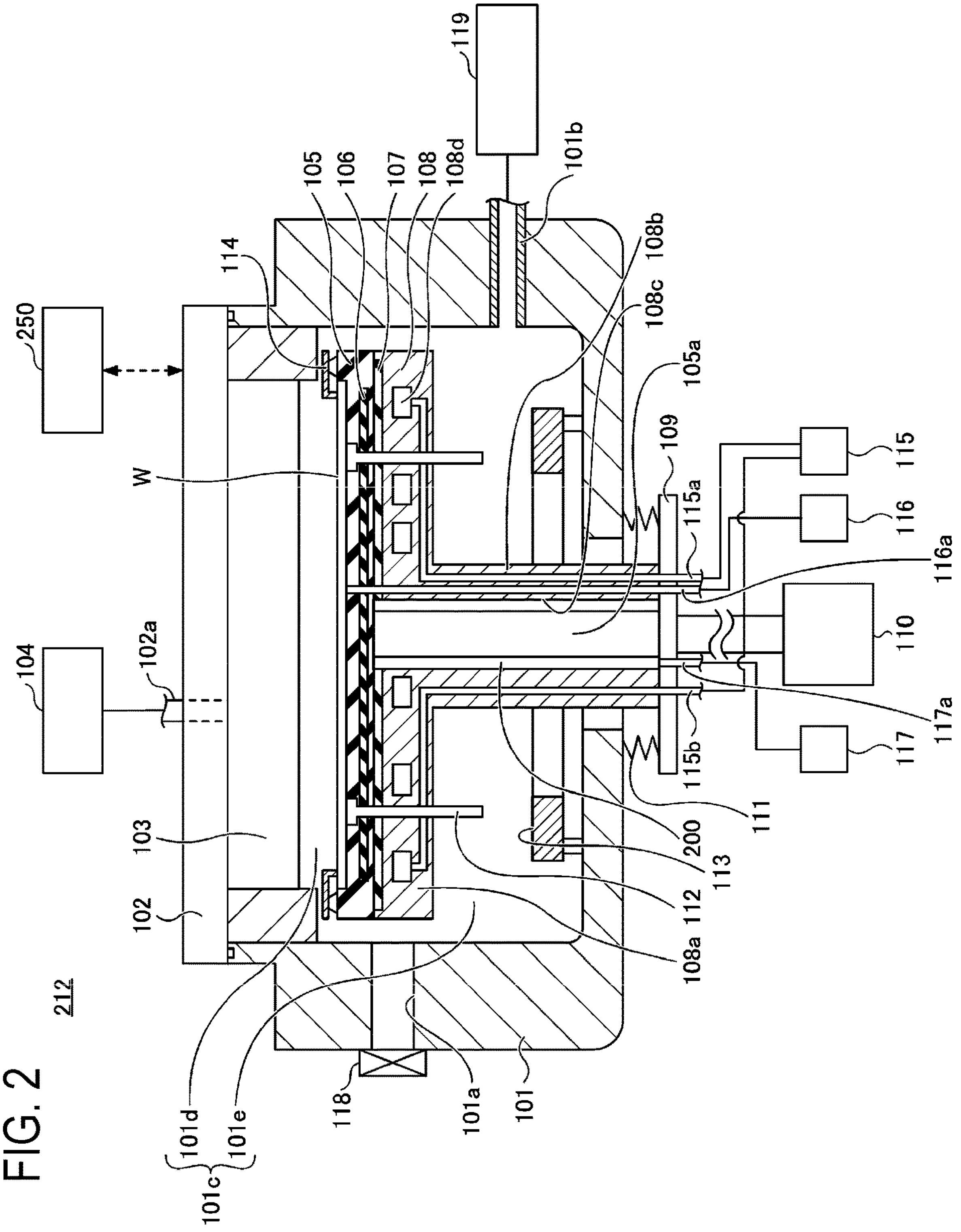
FIG. 2 is an example of a cross-sectional view of a substrate processing apparatus for forming a ruthenium film.

Next, an example of a configuration of the substrate processing apparatus 212 will be described with reference to FIG. 2. FIG. 2 is an example of a cross-sectional view of the substrate processing apparatus 212 configured to form the ruthenium film. The substrate processing apparatus 212 illustrated in FIG. 2 is a chemical vapor deposition (CVD) apparatus, for example, an apparatus configured to form the ruthenium film on the front surface of the substrate W. The substrate processing apparatus 213 performs a predetermined process such as a film forming process in a processing container in a depressurized vacuum atmosphere by supplying a film forming gas such as a ruthenium-containing gas (e.g., dodecacarbonyl triruthenium ($Ru_3(CO)_{12}$)).

A main body container 101 is a bottomed container having an opening at an upper portion thereof. A support 102 supports a gas ejection mechanism 103. In addition, since the support 102 closes the upper opening of the main body container 101, the main body container 101 is sealed to form a processing chamber **101*c*. A gas supply 104 supplies a film forming gas to the gas ejection mechanism 103 via a pipe 102*a* penetrating the support 102. Here, the film forming gas includes a ruthenium-containing gas and a carrier gas. The ruthenium-containing gas (raw material gas) is a precursor for forming the ruthenium film on the substrate W and is, for example, $Ru_3(CO)_{12}$ gas. The carrier gas is a gas that carries $Ru_3(CO)_{12}$ gas and is, for example, CO gas. In addition, the CO gas serves as a decomposition suppression gas that lowers a partial pressure of $Ru_3(CO)_{12}$ in the film forming gas and suppresses decomposition of $Ru_3(CO)_{12}$. The film forming gas supplied from the gas supply 104 is supplied from the gas ejection mechanism 103 into the processing chamber 101*c***.

A stage 105 is a member formed in a flat disk shape by using, for example, aluminum nitride or quartz as a material thereof and configured to place the substrate W thereon. A heater 106 configured to heat the substrate W is provided inside the stage 105. The heater 106 is constituted with, for example, a sheet-shaped resistance-heating element, and generates heat by being supplied with power from a power supply (not illustrated). By heating a placement surface of the stage 105, the substrate W is heated to a predetermined process temperature appropriate for film formation. For example, the heater 106 heats the substrate W placed on the stage 105 to, for example, 100 degrees C. to 300 degrees C.

In addition, the stage 105 includes a support **105*a*, which has one end extending downward from a center of a bottom surface of the stage 105 to penetrate a bottom portion of the main body container 101 and is supported on a lifting mechanism 110 via a lifting plate 109**.

A temperature control jacket 108 as a temperature control member is provided below the stage 105. The temperature control jacket 108 includes a plate **108*a* formed in an upper portion thereof and having substantially the same size as the stage 105, and a shaft 108*b* formed in a lower portion thereof and having a diameter greater than the support 105*a*. In addition, the temperature control jacket 108 includes a hole 108***c* formed in a central portion thereof and penetrating the plate 108*a* and the shaft 108*b* in a vertical direction.

The temperature control jacket 108 accommodates the support 105*a* in the hole 108*c*, and is disposed to cover the support 105*a* with the hole 108*c* and to cover an entire rear surface of the stage 105. Since the diameter of the hole 108*c* is greater than the diameter of the support 105*a*, a gap (not illustrated) is formed between the support 105*a* and the temperature control jacket 108. The gap (not illustrated) may be, for example, about 1 mm to 5 mm.

The temperature control jacket 108 has a coolant flow path 108*d* formed inside the plate 108*a*, and two coolant pipes 115*a* and 115*b* provided inside the shaft 108*b*. One end of the coolant flow path 108*d* is connected to one coolant pipe 115*a*, and the other end thereof is connected to the other coolant pipe 115*b*. The coolant pipes 115*a* and 115*b* are connected to a coolant unit 115.

The coolant unit 115 is, for example, a chiller unit. The coolant unit 115 is configured to be capable of controlling a temperature of a coolant, and supplies the coolant at a predetermined temperature to the coolant pipe 115*a*. The coolant is supplied from the coolant unit 115 to the coolant flow path 108*d* via the coolant pipe 115*a*. The coolant supplied to the coolant flow path 108*d* returns to the coolant unit 115 via the coolant pipe 115*b*. The temperature control jacket 108 is configured to be capable of performing a temperature control by circulating the coolant, such as cooling water, in the coolant flow path 108*d*.

A heat insulating ring 107 as a heat insulating member is disposed between the stage 105 and the temperature control jacket 108. The heat insulating ring 107 is formed of, for example, SUS316, A5052, titanium (Ti), ceramic, or the like in a disk shape.

Between the heat insulating ring 107 and the stage 105, a gap, which is in communication with the temperature control jacket 108 from the hole 108*c* to a periphery of the temperature control jacket 108, is formed in an entire circumferential direction. For example, the heat insulating ring 107 is provided with a plurality of protrusions on a top surface thereof facing the stage 105.

On the heat insulating ring 107, the plurality of protrusions is formed concentrically in a plurality of (e.g., two) rows at intervals in the circumferential direction. The protrusions may be formed concentrically in at least one row.

The shaft 108*b* of the temperature control jacket 108 penetrates the bottom portion of the main body container 101. A lower end portion of the temperature control jacket 108 is supported by the lifting mechanism 110 via the lifting plate 109 disposed below the main body container 101. Since a bellows 111 is provided between the bottom portion of the main body container 101 and the lifting plate 109, airtightness in the main body container 101 is also maintained when the lifting plate 109 moves vertically.

By raising and lowering the lifting plate 109 by the lifting mechanism 110, the stage 105 can be raised and lowered between a processing position (see FIG. 2) at which the substrate W is processed and a delivery position (not illustrated) at which the substrate W is delivered between the stage 105 and an external transfer mechanism (not illustrated) via a loading/unloading port 101*a*.

When the substrate W is delivered between the stage 105 and the external transfer mechanism (not illustrated), lifting pins 112 support the substrate W from a bottom surface of the substrate W and lift the substrate W from the placement surface of the stage 105. Each of the lifting pins 112 has a shaft and a head having a diameter greater than that of the shaft. In the stage 105 and the plate 108*a* of the temperature control jacket 108, through-holes into which the shafts of the lifting pins 112 are inserted are formed. In addition, on the placement surface of the stage 105, recesses for accommodating the heads of the lifting pins 112 are formed. An abutment member 113 is disposed below the lifting pins 112.

In a state in which the stage 105 is moved to the processing position of the substrate W (see FIG. 2), the heads of the lifting pins 112 are accommodated in the recesses, and the substrate W is placed on the placement surface of the stage 105. In addition, the heads of the lifting pins 112 are engaged in the recesses, the shafts of the lifting pins 112 penetrate the stage 105 and the plate 108*a* of the temperature control jacket 108, and lower ends of the shafts of the lifting pins 112 protrude from the plate 108*a* of the temperature control jacket 108. On the other hand, in a state in which the stage 105 is moved to the delivery position of the substrate W (not illustrated), the lower ends of the lifting pins 112 abut on the abutment member 113 and the heads of the lifting pins 112 protrude from the placement surface of the stage 105. As a result, the heads of the lifting pins 112 support the substrate W from the bottom surface of the substrate W, and lift the substrate W from the placement surface of the stage 105.

An annular member 114 is disposed above the stage 105. In the state in which the stage 105 is moved to the processing position of the substrate W (see FIG. 2), the annular member 114 is in contact with an outer peripheral portion of a top surface of the substrate W, and the substrate W is pressed against the placement surface of the stage 105 by a weight of the annular member 114. On the other hand, in the state in which the stage 105 is moved to the delivery position of the substrate W (not illustrated), the annular member 114 is engaged by an engagement portion (not illustrated) above the loading/unloading port 101*a* so that the delivery of the substrate W by the transfer mechanism (not illustrated) is not hindered.

A heat transfer gas supply 116 supplies a heat transfer gas (e.g., He gas) to a space between the rear surface of the substrate W placed on the stage 105 and the placement surface of the stage 105 via a pipe 116*a*.

A purge gas supply 117 supplies a purge gas to a side surface and the rear surface of the substrate W via a pipe 117*a*, a gap (not illustrated) formed between the support 105*a* of the stage 105 and the hole 108*c* in the temperature control jacket 108, a flow path (not illustrated) formed between the stage 105 and the heat insulating ring 107 and extending radially outward, and a vertical flow path (not illustrated) formed in the outer peripheral portion of the stage 105. The purge gas supplied to the side surface of the substrate W is supplied to a space between the bottom surface of the annular member 114 and the top surface of the stage 105. Thus, the film forming gas (a ruthenium-containing gas) is suppressed from flowing into the space between the bottom surface of the annular member 114 and the top surface of the stage 105, thereby preventing a film from being formed on the bottom surface of the annular member 114 or the top surface of the outer peripheral portion of the stage 105. Here, the purge gas supply 117 supplies a gas that suppresses decomposition of $Ru_3(CO)_{12}$, as a purge gas. The gas that suppresses the decomposition is, for example, CO gas.

A side wall of the main body container 101 is provided with the loading/unloading port 101*a* for loading and unloading the substrate W and a gate valve 118 for opening and closing the loading/unloading port 101*a*.

An exhauster 119 including a vacuum pump or the like is connected to a lower side wall of the main body container 101 via an exhaust pipe 101*b*. The interior of the main body container 101 is evacuated by the exhauster 119, so that the interior of the processing chamber 101*c* is set to and maintained at a predetermined vacuum atmosphere (e.g., 1.33 Pa).

The controller 250 controls operations of the substrate processing apparatus 212 by controlling the gas supply 104, the heater 106, the lifting mechanism 110, the coolant unit 115, the heat transfer gas supply 116, the purge gas supply 117, the gate valve 118, the exhauster 119, and the like.

An example of operations of the substrate processing apparatus 212 will be described. At the time of starting, the interior of the processing chamber 101*c* is set to a vacuum atmosphere by the exhauster 119. In addition, the stage 105 is moved to the delivery position.

The controller 250 opens the gate valve 118. Here, the substrate W is placed on the lifting pins 112 by the external transfer mechanism (not illustrated). When the transfer mechanism (not illustrated) comes out of the loading/unloading port 101*a*, the controller 250 closes the gate valve 118.

The controller 250 controls the lifting mechanism 110 to move the stage 105 to the processing position. At this time, as the stage 105 is raised, the substrate W placed on the lifting pins 112 is placed on the placement surface of the stage 105. In addition, the annular member 114 is brought into contact with the outer peripheral portion of the top surface of the substrate W, and presses the substrate W against the placement surface of the stage 105 by its own weight. As a result, an upper space 101*d* above the stage 105 and a lower space 101*e* below the stage 105 are defined in the processing chamber 101*c*.

At the processing position, the controller 250 operates the heater 106, and controls the gas supply 104 to supply the film forming gas from the gas ejection mechanism 103 into the upper space 101*d* of the processing chamber 101*c*. As a result, a predetermined process such as film formation is performed on the substrate W. After the process, the gas flows into the lower space 101*e* from the upper space 101*d* via a flow path on a side of the top surface of the annular member 114, and is exhausted via the exhaust pipe 101*b* by the exhauster 119.

At this time, the controller 250 controls the heat transfer gas supply 116 to supply the heat transfer gas to the space between the rear surface of the substrate W placed on the stage 105 and the placement surface of the stage 105. In addition, the controller 250 controls the purge gas supply 117 to supply the purge gas to the space between the bottom surface of the annular member 114 and the top surface of the stage 105. The purge gas flows into the lower space 101*e* via a flow path on a side of the bottom surface of the annular member 114, and is exhausted via the exhaust pipe 101*b* by the exhauster 119.

When the predetermined process is completed, the controller 250 controls the lifting mechanism 110 to move the stage 105 to the delivery position. At this time, when the stage 105 is lowered, the annular member 114 is engaged with the engagement portion (not illustrated). In addition, when the lower ends of the lifting pins 112 abut on the abutment member 113, the heads of the lifting pins 112 protrude from the placement surface of the stage 105 and lift the substrate W from the placement surface of the stage 105.

The controller 250 opens the gate valve 118. Here, the substrate W placed on the lifting pins 112 is unloaded by the external transfer mechanism (not illustrated). When the transfer mechanism (not illustrated) comes out of the loading/unloading port 101*a*, the controller 250 closes the gate valve 118.

As described above, with the substrate processing apparatus 212 illustrated in FIG. 2, it is possible to form the ruthenium film on the front surface of the substrate W. For example, a recess such as a trench may be formed on the front surface of the substrate W, and the substrate processing apparatus 212 is capable of embedding ruthenium in the recess.

<Substrate Processing Apparatus 211>

Figure 3:
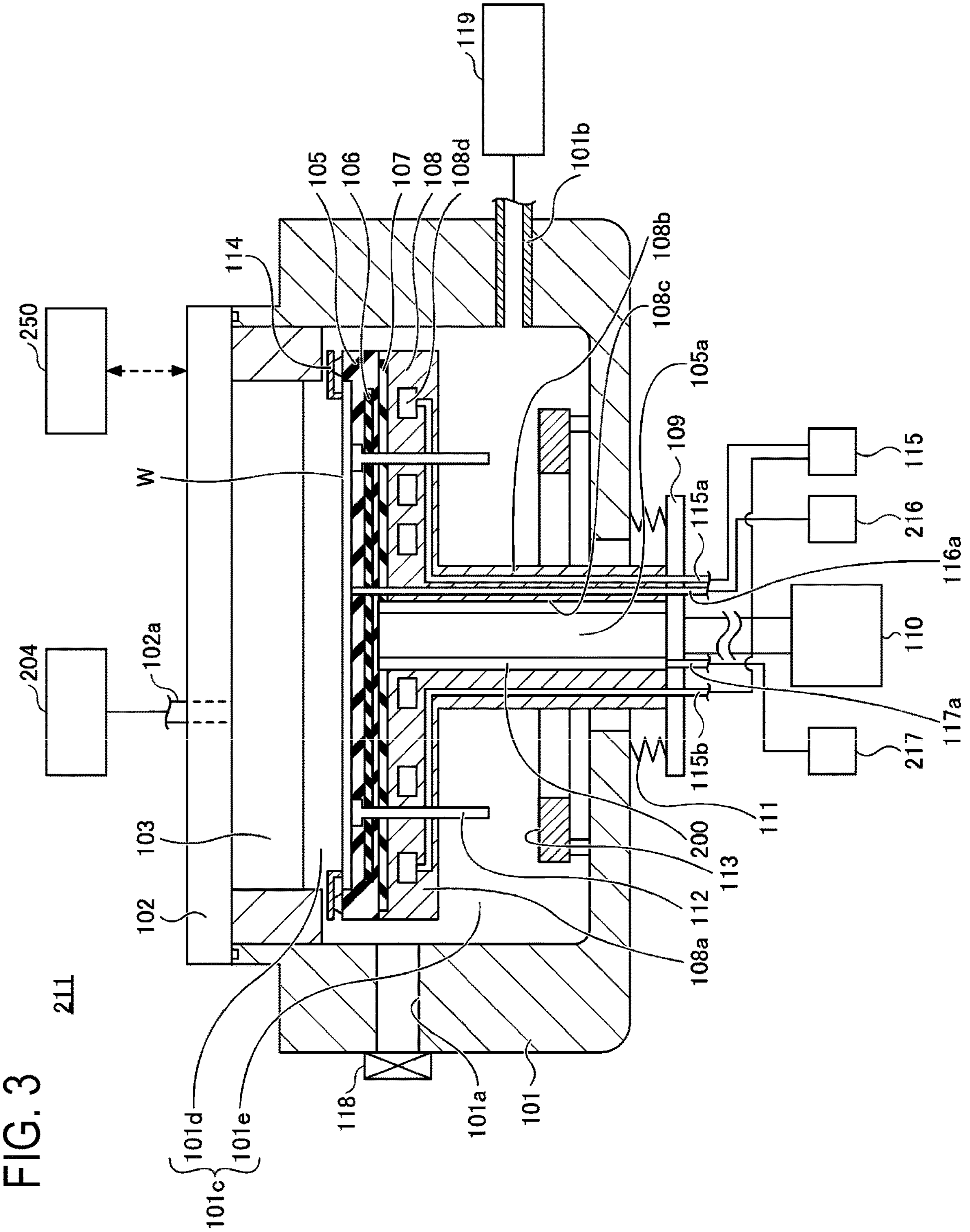
FIG. 3 is an example of a cross-sectional view of a substrate processing apparatus for forming an adsorption inhibition layer.

Next, an example of a configuration of the substrate processing apparatus 211 will be described with reference to FIG. 3. FIG. 3 is an example of a cross-sectional view of the substrate processing apparatus 211 configured to form an adsorption inhibition layer. The substrate processing apparatus 211 illustrated in FIG. 3 is an apparatus configured to form the adsorption inhibition layer on the rear surface of a substrate W by supplying an adsorption inhibition gas to the rear surface of the substrate W so that the adsorption inhibition gas is adsorbed on the rear surface of the substrate W. The substrate processing apparatus 211 may adsorb the adsorption inhibition gas on the rear surface and the side surface of the substrate W to form the adsorption inhibition layer on the rear surface and the side surface of the substrate W.

Compared with the substrate processing apparatus 212 (see FIG. 2), the substrate processing apparatus 211 includes a purge gas supply 204 and adsorption inhibition gas supplies 216 and 217, instead of the gas supply 104, the heat transfer gas supply 116, and the purge gas supply 117. Other configurations are the same as those of the substrate processing apparatus 212, and a redundant description will be omitted.

The adsorption inhibition gas supply 216 supplies the adsorption inhibition gas to the space between the rear surface of a substrate W placed on the stage 105 and the placement surface of the stage 105 via the pipe 116*a*. The adsorption inhibition gas supply 217 supplies the adsorption inhibition gas to the side surface and the rear surface of a substrate W via the pipe 117*a*, the gap (not illustrated) formed between the support 105*a* of the stage 105 and the hole 108*c* in the temperature control jacket 108, the flow path (not illustrated) formed between the stage 105 and the heat insulating ring 107 extending radially outward, and the vertical flow path (not illustrated) formed in the outer peripheral portion of the stage 105. Here, the adsorption inhibition gas is, for example, $Cl_2$ gas. The adsorption inhibition gas will be described by taking $Cl_2$ gas as an example, but is not limited thereto. The adsorption inhibition gas may be a halogen-containing gas. The adsorption inhibition gas may be a Cl-containing gas.

The purge gas supply 204 supplies a purge gas to the gas ejection mechanism 103 via the pipe 102*a* penetrating the support 102. Here, the purge gas is, for example, $N_2$ gas. The purge gas supplied from the purge gas supply 204 is supplied from the gas ejection mechanism 103 to the upper space 101*d* of the processing chamber 101*c*. Thus, the adsorption inhibition gas is prevented from flowing into the upper space 101*d* so that the adsorption inhibition layer is prevented from being formed on the front surface of the substrate W.

An example of operations of the substrate processing apparatus 211 will be described. At the time of starting, the interior of the processing chamber 101*c* is set to a vacuum atmosphere formed by the exhauster 119. In addition, the stage 105 is moved to the delivery position.

The controller 250 opens the gate valve 118. Here, the substrate W is placed on the lifting pins 112 by the external transfer mechanism (not illustrated). When the transfer mechanism (not illustrated) comes out of the loading/unloading port 101*a*, the controller 250 closes the gate valve 118.

The controller 250 controls the lifting mechanism 110 to move the stage 105 to the processing position. At this time, as the stage 105 is raised, the substrate W placed on the lifting pins 112 is placed on the placement surface of the stage 105. In addition, the annular member 114 is brought into contact with the outer peripheral portion of the top surface of the substrate W, and presses the substrate W against the placement surface of the stage 105 by its own weight. As a result, the upper space 101*d* above the stage 105 and the lower space 101*e* below the stage 105 are defined in the processing chamber 101*c*.

At the processing position, the controller 250 operates the heater 106 to control a temperature of the substrate W placed on the stage 105. The temperature of the substrate W may be, for example, 20 degrees C. to 250 degrees C. In addition, the controller 250 controls the adsorption inhibition gas supply 216 to supply the adsorption inhibition gas to the space between the rear surface of the substrate W placed on the stage 105 and the placement surface of the stage 105. In addition, the controller 250 controls the adsorption inhibition gas supply 217 to supply the adsorption inhibition gas to the space between the bottom surface of the annular member 114 and the top surface of the stage 105. As a result, the adsorption inhibition gas is adsorbed on the rear surface and the side surface of the substrate W, and the adsorption inhibition layer is formed. The excessive adsorption inhibition gas flows into the lower space 101*e* via the flow path on the side of the bottom surface of the annular member 114, and is exhausted via the exhaust pipe 101*b* by the exhauster 119.

In addition, the controller 250 controls the purge gas supply 204 to supply the purge gas from the gas ejection mechanism 103 into the upper space 101*d* of the processing chamber 101*c*. The purge gas supplied to the upper space 101*d* prevents the adsorption inhibition gas from flowing into the upper space 101*d*. That is, the adsorption inhibition layer is prevented from being formed on the front surface of the substrate W. The purge gas flows into the lower space 101*e* from the upper space 101*d* via the flow path on the side of the top surface of the annular member 114, and is exhausted through the exhaust pipe 101*b* by the exhauster 119.

When a predetermined process is completed, the controller 250 controls the lifting mechanism 110 to move the stage 105 to the delivery position. At this time, when the stage 105 is lowered, the annular member 114 is engaged with the engagement portion (not illustrated). In addition, when the lower ends of the lifting pins 112 abut on the abutment member 113, the heads of the lifting pins 112 protrude from the placement surface of the stage 105 and lift the substrate W from the placement surface of the stage 105.

The controller 250 opens the gate valve 118. Here, the substrate W placed on the lifting pins 112 is unloaded by an external transfer mechanism (not illustrated). When the transfer mechanism (not illustrated) comes out of the loading/unloading port 101*a*, the controller 250 closes the gate valve 118.

As described above, with the substrate processing apparatus 211 illustrated in FIG. 3, it is possible to form the adsorption inhibition layer that inhibits adsorption of ruthenium on the rear surface and the side surface of the substrate W.

<Substrate Processing Apparatus 213>

Figure 4:
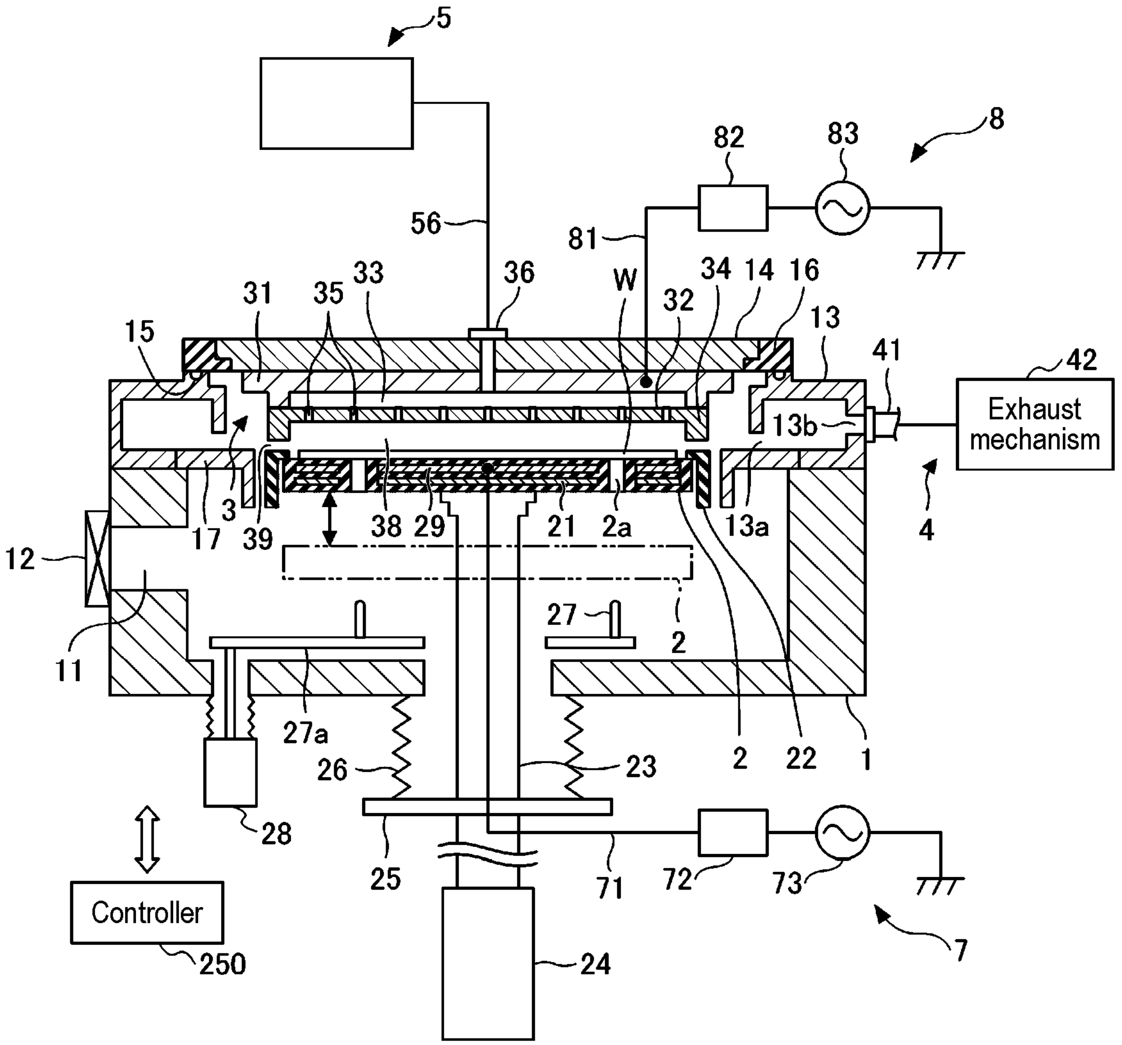
FIG. 4 is an example of a cross-sectional view of a substrate processing apparatus for removing an adsorption inhibition layer.

Next, an example of a configuration of the substrate processing apparatus 213 will be described with reference to FIG. 4. FIG. 4 is an example of a cross-sectional view of the substrate processing apparatus 213 configured to remove the adsorption inhibition layer. The substrate processing apparatus 213 illustrated in FIG. 4 generates plasma in the processing container depressurized to a vacuum atmosphere to remove the adsorption inhibition layer formed on the rear surface and the side surface of the substrate W.

As illustrated in FIG. 4, the substrate processing apparatus 213 includes a processing container 1, a stage 2, a shower head 3, an exhauster 4, a gas supply mechanism 5, a radio frequency (RF) power supply 7, and a radio frequency (RF) power supply 8.

The processing container 1 is made of a metal such as aluminum, and has a substantially cylindrical shape. The processing container 1 accommodates the substrate W. A loading/unloading port 11 for loading and unloading the substrate W is formed in a side wall of the processing container 1, and is opened and closed by a gate valve 12. An annular exhaust duct 13 having a rectangular cross section is provided on a main body of the processing container 1. A slit 13*a* is formed along an inner peripheral surface of the exhaust duct 13. An exhaust port 13*b* is formed in an outer wall of the exhaust duct 13. On a top surface of the exhaust duct 13, a ceiling wall 14 is provided to close an upper opening of the processing container 1 via an insulator 16. A space between the exhaust duct 13 and the insulator 16 is airtightly sealed with a seal ring 15. A partition 17 partitions the interior of the processing container 1 into upper and lower portions when the stage 2 (and a cover 22) is raised to a processing position.

The stage 2 horizontally supports the substrate W in the processing container 1. The stage 2 is formed in a disk shape having a size corresponding to the substrate W, and is supported by a support 23. The stage 2 is formed of a ceramic material such as AlN or a metallic material such as aluminum or nickel alloy, and a heater 21 configured to heat the substrate W is embedded in the stage 2. The heater 21 generates heat by being fed with power from a heater power supply (not illustrated). The substrate W is controlled to a predetermined temperature by controlling an output of the heater 21 by a temperature signal of a thermocouple (not illustrated) provided in a vicinity of a top surface of the stage 2. The stage 2 is provided with the cover 22 formed of ceramic such as alumina to cover an outer peripheral region of a top surface and a side surface of the stage 2.

The support 23 that supports the stage 2 is provided on a bottom surface of the stage 2. The support 23 extends downward from a center of a bottom surface of the stage 2 to below the processing container 1 via a hole formed in a bottom wall of the processing container 1, and a lower end of the support 23 is connected to a lifting mechanism 24. The stage 2 is raised and lowered via the support 23 by the lifting mechanism 24 between a processing position illustrated in FIG. 4 and a delivery position indicated by the alternating long and two short dashes line below the processing position at which the substrate W is transferable. A flange 25 is provided on the support 23 below the processing container 1, and a bellows 26, which partitions an atmosphere in the processing container 1 from the air and expands and contracts in response to a vertical movement of the stage 2, is provided between a bottom surface of the processing container 1 and the flange 25.

Three substrate support pins 27 (only two of which are illustrated) are provided in a vicinity of the bottom surface of the processing container 1 to protrude upward from a lifting plate 27*a*. The substrate support pins 27 are raised and lowered via the lifting plate 27*a* by a lifting mechanism 28 provided below the processing container 1. The substrate support pins 27 are inserted into through-holes 2*a* formed in the stage 2 located at the delivery position, and are configured to protrude and sink with respect to the top surface of the stage 2. By raising and lowering the substrate support pins 27, delivery of the substrate W is performed between a transfer mechanism (not illustrated) and the stage 2.

The shower head 3 supplies a processing gas into the processing container 1 in a shower form. The shower head 3 is made of a metal, and is provided to face the stage 2. The shower head 3 has a diameter that is substantially the same as that of the stage 2. The shower head 3 includes a main body 31 fixed to the ceiling wall 14 of the processing container 1, and a shower plate 32 connected to the main body 31 from below. A gas diffusion space 33 is formed between the main body 31 and the shower plate 32. In the gas diffusion space 33, a gas introduction hole 36 is provided to penetrate centers of the main body 31 and the ceiling wall 14 of the processing container 1. An annular protrusion 34 protruding downward is formed on a peripheral edge portion of the shower plate 32. Gas ejection holes 35 are formed in a flat surface inward of the annular protrusion 34. In a state in which the stage 2 is located at the processing position, a processing space 38 is formed between the stage 2 and the shower plate 32, and a top surface of the cover 22 and the annular protrusion 34 are close to each other so as to form an annular gap 39.

The exhauster 4 evacuates the interior of the processing container 1. The exhauster 4 includes an exhaust pipe 41 connected to the exhaust port 13*b*, and an exhaust mechanism 42 connected to the exhaust pipe 41 and including a vacuum pump, a pressure control valve, or the like. During the processing, the gas in the processing container 1 reaches the exhaust duct 13 via the slit 13*a*, and is exhausted from the exhaust duct 13 via the exhaust pipe 41 by the exhaust mechanism 42.

The gas supply mechanism 5 supplies a gas into the processing container 1 from the gas introduction hole 36 via a gas line 56. The gas supply mechanism 5 is configured to be capable of supplying argon (Ar) gas.

In addition, the substrate processing apparatus 213 is a capacitively coupled plasma apparatus, in which the stage 2 serves as a lower electrode and the shower head 3 serves as an upper electrode.

A lower electrode 29 is provided in the stage 2. The lower electrode 29 is fed with radio frequency power for bias by the RF power supply 7. The RF power supply 7 includes a feed line 71, a matcher 72, and a radio frequency power supply 73. The feed line 71 interconnects the lower electrode 29 (the stage 2) and the radio frequency power supply 73 via the matcher 72. The matcher 72 includes a circuit for matching an output reactance of the radio frequency power supply 73 and a reactance of a load (the lower electrode). The radio frequency power supply 73 supplies radio frequency power of, for example, 13.56 MHz.

The shower head 3 serving as the upper electrode is fed with radio frequency power serving as a plasma source for plasma generation by the RF power supply 8. The RF power supply 8 includes a feed line 81, a matcher 82, and a radio frequency power supply 83. The feed line 81 interconnects the upper electrode 29 (the shower head 3) and the radio frequency power supply 83 via the matcher 82. The matcher 82 includes a circuit for matching an output reactance of the radio frequency power supply 83 and a reactance of a load (the upper electrode). The radio frequency power supply 83 supplies radio frequency power of, for example, 60.0 MHz.

An example of operations of the substrate processing apparatus 213 will be described. At the time of starting, the interior of the processing container 1 is set to a vacuum atmosphere formed by the exhaust mechanism 42. In addition, the stage 2 is moved to the delivery position.

The controller 250 opens the gate valve 12. Here, the substrate W is placed on the substrate support pins 27 by an external transfer mechanism (not illustrated). At this time, the transfer mechanism places the substrate W with a rear surface (the surface on which the adsorption inhibition layer is formed) of the substrate W facing upward. When the transfer mechanism (not illustrated) comes out from the loading/unloading port 11, the controller 250 closes the gate valve 12.

The controller 250 controls the lifting mechanism 28 to place the substrate W on the stage 2. The controller 250 controls the lifting mechanism 24 to move the stage 2 to the processing position. As a result, the processing space 38 is defined between the stage 2 and the shower plate 32.

At the processing position, the controller 250 operates the heater 21 to control the temperature of the substrate W placed on the stage 2. The temperature of the substrate W may be, for example, 20 degrees C. to 250 degrees C. The controller 250 controls the gas supply mechanism 5 to supply argon gas to the processing space 38 from the gas ejection holes 35 of the shower plate 32. The controller 250 controls the RF power supply 7 and the RF power supply 8 to generate argon plasma in the processing space 38. As a result, the adsorption inhibition layer formed on the rear surface and the side surface of the substrate W is removed. The gas in the processing space 38 is exhausted by the exhaust mechanism 42 via the annular gap 39, the slit 13*a*, the exhaust port 13*b*, and the exhaust pipe 41.

When a predetermined process is completed, the controller 250 controls the lifting mechanism 24 to move the stage 2 to the delivery position. The controller 250 controls the lifting mechanism 28 to support the substrate W with the substrate support pins 27.

The controller 250 opens the gate valve 12. Here, the substrate W placed on the substrate support pins 27 is unloaded by an external transfer mechanism (not illustrated). When the transfer mechanism (not illustrated) comes out from the loading/unloading port 11, the controller 250 closes the gate valve 12.

As described above, with the substrate processing apparatus 213 illustrated in FIG. 4, it is possible to remove the adsorption inhibition layer formed on the rear surface and the side surface of the substrate W.

<Example of Ruthenium Film Forming Process>

Figure 5:
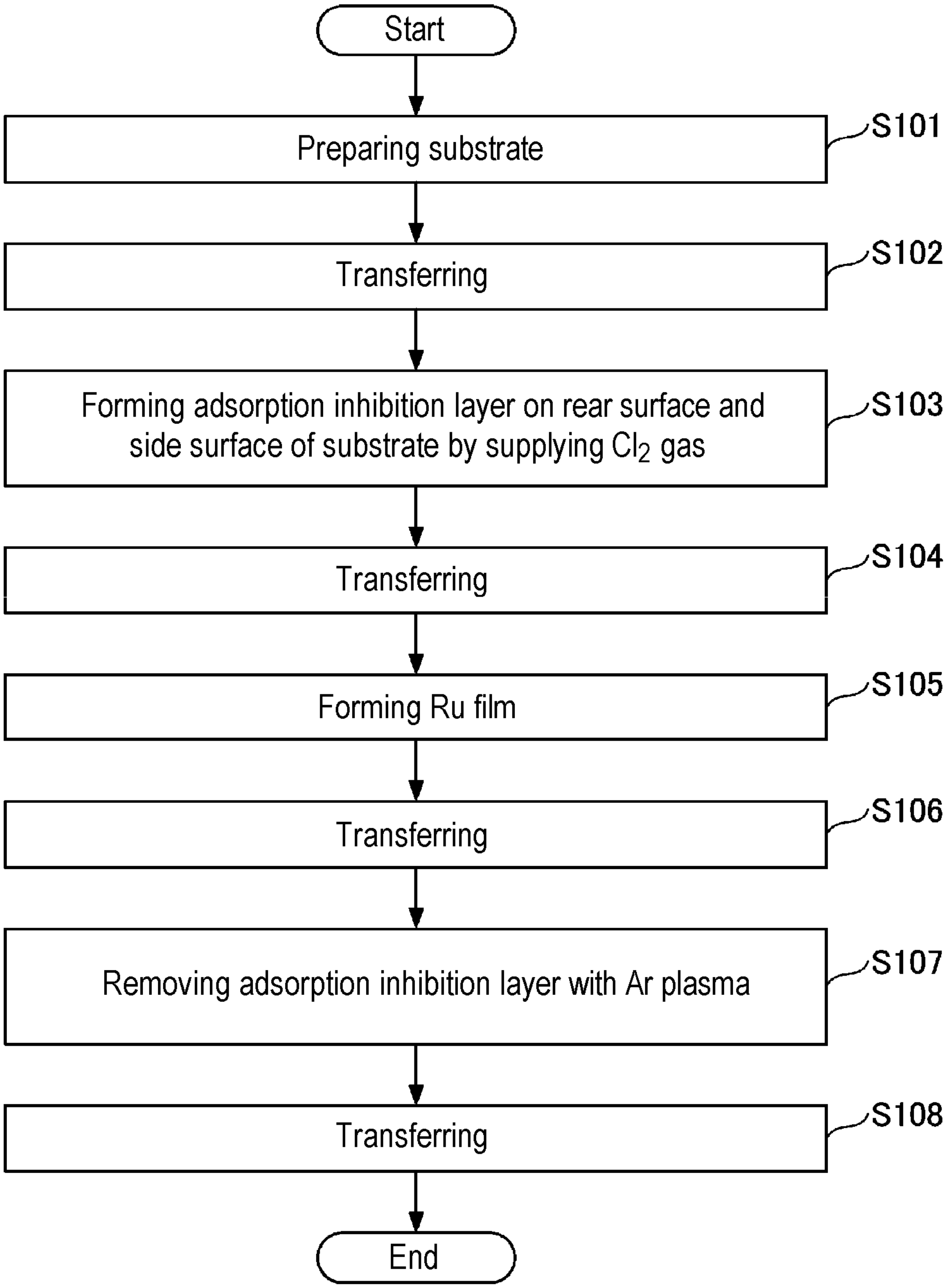
FIG. 5 is a flowchart illustrating an example of a film forming process in the substrate processing system.

Next, an example of a process of forming a ruthenium film in the substrate processing system 200 will be described with reference to FIG. 5. FIG. 5 is a flowchart illustrating an example of a film forming process in the substrate processing system 200 according to the embodiment.

In step S101, a substrate W is provided. Specifically, a carrier accommodating the substrate W is installed in the load port.

In step S102, the controller 250 controls the transfer mechanism of the atmospheric transfer chamber 240, the load-lock chamber 230, and the transfer mechanism of the vacuum transfer chamber 220 to transfer the substrate W from the carrier to the substrate processing apparatus 211.

In step S103, the controller 250 controls the substrate processing apparatus 211 (see FIG. 3) to form the adsorption inhibition layer on the rear surface and the side surface of the substrate W. That is, the adsorption inhibition gas is supplied to the rear surface and the side surface of the substrate W so that the adsorption inhibition gas is adsorbed on the rear surface and the side surface of the substrate W. Thus, the adsorption inhibition layer is formed on the rear surface and the side surface of the substrate W.

In step S104, the controller 250 controls the transfer mechanism of the vacuum transfer chamber 220 to transfer the substrate W from the substrate processing apparatus 211 to the substrate processing apparatus 212.

In step S105, the controller 250 controls the substrate processing apparatus 212 (see FIG. 2) to form a ruthenium film on the front surface (top surface) of the substrate W. That is, the film forming gas is supplied to the front surface (top surface) of the substrate W, and the ruthenium-containing gas ($Ru_3(CO)_{12}$) is adsorbed on the front surface (top surface) of the substrate W. Then, the adsorbed ruthenium-containing gas is decomposed to form the ruthenium film.

Even when the film forming gas (ruthenium-containing gas) has infiltrated into the space on the side of the bottom surface of the annular member 114 via the gap between the substrate W and the annular member 114, it is possible to prevent the ruthenium film from being formed on the rear surface and the side surface of the substrate W, because the adsorption inhibition layer is formed on the rear surface and the side surface of the substrate W. In addition, it is possible to prevent the rear surface and the side surface of the substrate W from being contaminated with ruthenium.

By the flow of the purge gas supplied from the purge gas supply 117, it is possible to force out the film forming gas (ruthenium-containing gas) that has infiltrated into the space on the side of the bottom surface of the annular member 114.

In addition, by using CO gas as the purge gas, it is possible to lower the partial pressure of $Ru_3(CO)_{12}$ and to suppress the decomposition of $Ru_3(CO)_{12}$, thereby further preventing the ruthenium film from being formed. Furthermore, it is possible to prevent the rear surface and the side surface of the substrate W from being contaminated with ruthenium.

In step S106, the controller 250 controls the transfer mechanism of the vacuum transfer chamber 220 to transfer the substrate W from the substrate processing apparatus 212 to the substrate processing apparatus 213. Here, the transfer mechanism of the vacuum transfer chamber 220 transfers the substrate W to the substrate processing apparatus 213 with the rear surface (the surface on which the adsorption inhibition layer is formed) being directed upward.

In step S107, the controller 250 controls the substrate processing apparatus 213 (see FIG. 4) to remove the adsorption inhibition layer on the rear surface and the side surface of the substrate W. That is, the adsorption inhibition layer formed on the rear surface and the side surface of the substrate W is removed by Ar plasma.

In step S108, the controller 250 controls the transfer mechanism of the vacuum transfer chamber 220, the load-lock chamber 230, and the transfer mechanism of the atmospheric transfer chamber 240 to transfer the substrate W from the substrate processing apparatus 213 to a carrier and accommodate the substrate W in the carrier. Here, the transfer mechanism of the vacuum transfer chamber 220 transfers the substrate W with the front surface (the surface on which the ruthenium film is formed) facing upward.

As described above, with the ruthenium film forming process in the substrate processing system 200 illustrated in FIG. 5, it is possible to form the ruthenium film on the front surface of the substrate W. Furthermore, it is possible to prevent the rear surface and the side surface of the substrate W from being contaminated with ruthenium.

[Evaluation Test]

Figure 6:
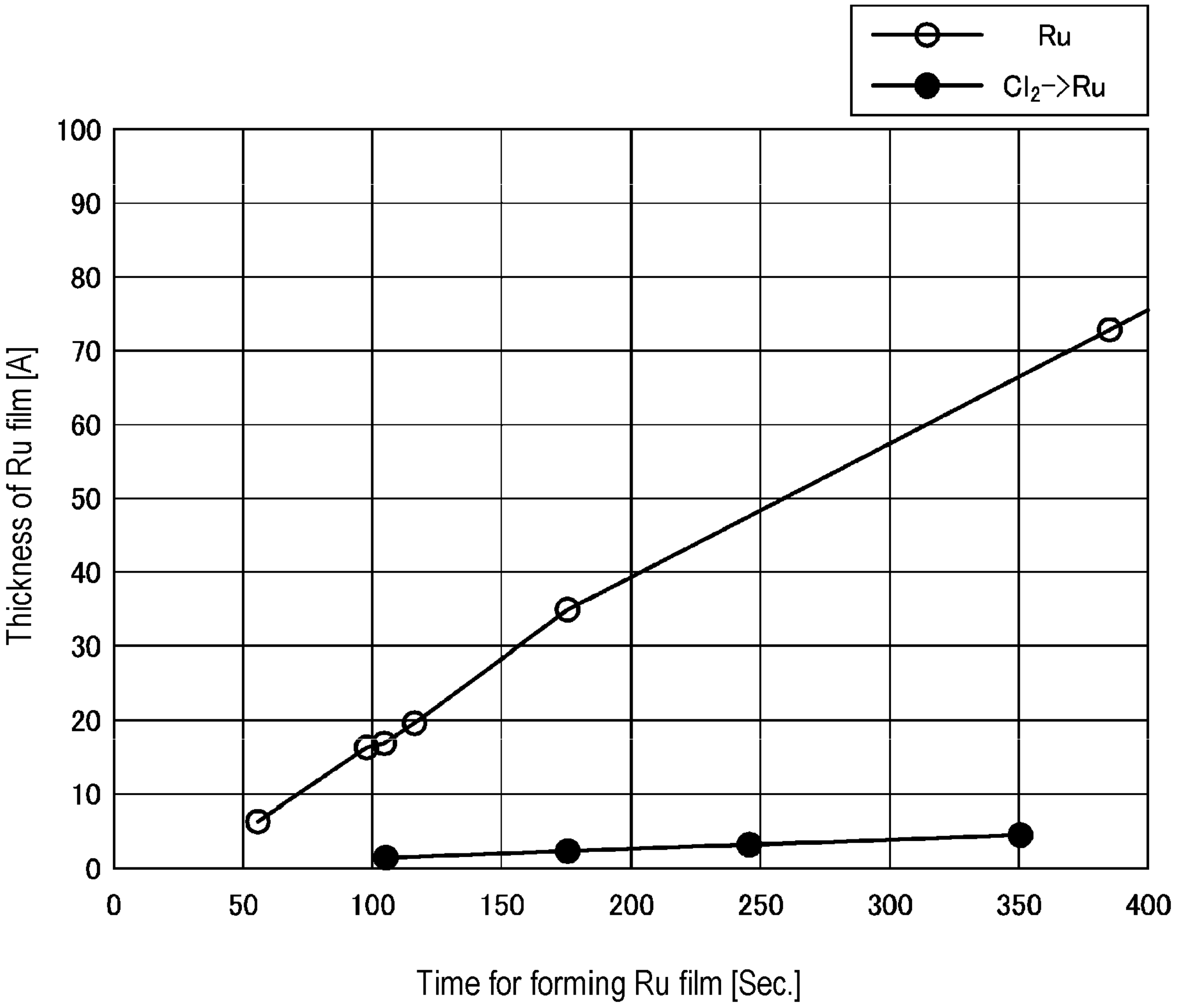
FIG. 6 is an example of a graph illustrating formation of a ruthenium film.

Here, a description will be made on an evaluation test, which was performed in connection with the present disclosure. FIG. 6 is an example of a graph illustrating film formation of ruthenium. The horizontal axis represents a film formation time (unit: seconds) of a ruthenium film. That is, the time for supplying $Ru_3(CO)_{12}$ gas as a film forming gas into the processing chamber 101*c* is represented. The vertical axis represents a thickness (unit: angstroms) of the ruthenium film formed on a substrate W. In addition, results when a ruthenium film was formed on a substrate W having a front surface formed of $SiO_x$ are indicated by white circles. Furthermore, results when a ruthenium film was formed on a substrate, which has a front surface formed of $SiO_x$, after forming an adsorption inhibition layer by exposing the substrate W to $Cl_2$ gas are indicated by black circles.

As shown in FIG. 6, it was confirmed that it is possible to suppress adsorption of the ruthenium film by supplying $Cl_2$ gas to the substrate W to form the adsorption inhibition layer on the substrate W.

According to the present disclosure, it is possible to provide a substrate processing method and a substrate processing apparatus that are capable of suppressing formation of a ruthenium film on an end portion or a rear surface of a substrate, and suppressing contamination of the end portion or the rear surface of the substrate with ruthenium.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a ruthenium film on a substrate by supplying a ruthenium-containing gas, the method comprising:
- forming an adsorption inhibition layer that inhibits adsorption of the ruthenium-containing gas by supplying an adsorption inhibition gas to an end portion and a rear surface of the substrate;
- transferring the substrate to a chamber; and
- forming the ruthenium film on the substrate by supplying the ruthenium-containing gas to the chamber.

2. The method of claim 1, further comprising removing the adsorption inhibition layer.

3. The method of claim 1, wherein the forming the ruthenium film includes supplying a decomposition suppression gas that suppresses decomposition of the ruthenium-containing gas to the end portion and the rear surface of the substrate.

4. The method of claim 3, wherein the decomposition suppression gas is CO gas.

5. The method of claim 4, wherein the adsorption inhibition gas is a halogen-containing gas.

6. The method of claim 5, wherein the adsorption inhibition gas is a Cl-containing gas.

7. The method of claim 6, wherein the adsorption inhibition gas is $Cl_2$ gas.

8. The method of claim 7, wherein the ruthenium-containing gas is $Ru_3(CO)_{12}$ gas.

9. The method of claim 1, wherein the adsorption inhibition gas is a halogen-containing gas.

10. The method of claim 1, wherein the adsorption inhibition gas is a Cl-containing gas.

11. The method of claim 1, wherein the adsorption inhibition gas is Cl2 gas.

12. The method of claim 1, wherein the ruthenium-containing gas is $Ru_3(CO)_{12}$ gas.

* * * * *